(12) United States Patent
Man et al.

(10) Patent No.: US 12,249,382 B2
(45) Date of Patent: Mar. 11, 2025

(54) READING CIRCUIT FOR DIFFERENTIAL OTP MEMORY

(71) Applicant: SG MICRO CORP, Beijing (CN)

(72) Inventors: Xuecheng Man, Beijing (CN); Xuan Ma, Beijing (CN)

(73) Assignee: SG MICRO CORP, Beijing (CN)

( * ) Notice: Subject to any disclaimer, the term of this patent is extended or adjusted under 35 U.S.C. 154(b) by 157 days.

(21) Appl. No.: 18/257,946

(22) PCT Filed: Oct. 21, 2021

(86) PCT No.: PCT/CN2021/125343
§ 371 (c)(1),
(2) Date: Jun. 16, 2023

(87) PCT Pub. No.: WO2022/127361
PCT Pub. Date: Jun. 23, 2022

(65) Prior Publication Data
US 2024/0105274 A1 Mar. 28, 2024

(30) Foreign Application Priority Data
Dec. 18, 2020 (CN) .......................... 202011508418.5

(51) Int. Cl.
*G11C 17/18* (2006.01)
*G11C 17/16* (2006.01)
(52) U.S. Cl.
CPC .............. *G11C 17/18* (2013.01); *G11C 17/16* (2013.01)
(58) Field of Classification Search
CPC ................................ G11C 17/18; G11C 17/16
(Continued)

(56) References Cited

U.S. PATENT DOCUMENTS 7,200,064 B1    4/2007  Boerstler et al.
7,936,582 B1 *  5/2011  Zhou ...................... G11C 17/18
                                                              365/96
(Continued)

FOREIGN PATENT DOCUMENTS

CN    101283412 A    10/2008
CN    108520767 A     9/2018
(Continued)

OTHER PUBLICATIONS

International Search Report (including English translation) and Written Opinion for International Application No. PCT/CN2021/125343, dated Oct. 21, 2021, 8 pages.
(Continued)

*Primary Examiner* — Muna A Techane
(74) *Attorney, Agent, or Firm* — Westman, Champlin & Koehler, P.A.

(57) ABSTRACT

A field of memory technologies and a reading circuit for a differential one time programmable (OTP) memory including a first and second memory cells in a differentially symmetrical structure, the reading circuit connects between the first and second memory cells and includes: a detector having a first and second connected to respective first and second memory cells, configured to detect one of a resistance value of a first or second fuse of respective first and second memory cells, and a resistance difference between the first and second fuse after a burn-in operation of the first or second memory is completed; and a latch connected to the detector, provides a readout data according to one of the resistance value of the first or second fuse, and the resistance difference. The reading circuit may both read out data normally and detect a resistance value of the fuse.

22 Claims, 9 Drawing Sheets

(58) Field of Classification Search
USPC .......................................................... 365/96
See application file for complete search history.

(56) References Cited

U.S. PATENT DOCUMENTS

| | | | |
|---|---|---|---|
| 2004/0190346 A1* | 9/2004 | Pasolini | G11C 7/065 |
| | | | 365/189.15 |
| 2004/0232446 A1* | 11/2004 | Nishimura | G01R 31/31713 |
| | | | 257/202 |
| 2005/0212527 A1 | 9/2005 | Wu | |
| 2005/0247997 A1 | 11/2005 | Chung et al. | |
| 2007/0081406 A1 | 4/2007 | Boerstler et al. | |
| 2009/0109724 A1 | 4/2009 | Buer et al. | |
| 2014/0015553 A1 | 1/2014 | Yoon et al. | |
| 2016/0329107 A1 | 11/2016 | Ryu | |
| 2019/0074071 A1* | 3/2019 | Daanen | H10B 69/00 |
| 2023/0012334 A1* | 1/2023 | Ji | G11C 17/18 |

FOREIGN PATENT DOCUMENTS

| | | |
|---|---|---|
| CN | 110830022 A | 2/2020 |
| CN | 114647272 A | 6/2022 |
| CN | 114649042 A | 6/2022 |
| JP | 2010272825 A | 12/2010 |

OTHER PUBLICATIONS

First Office Action, including Search Report, for Chinese Patent Application No. 202011508418.5, dated Feb. 1, 2024, 23 pages.

\* cited by examiner

200

220

210

210

| Burn-in value | OTP_TH | OTP_SIDE | Rd1/2 | Nmod_sw | Side_p | Brside_p | Side_n | Brside_n | Expected Value | Error Value | Threshold resistance value |
|---|---|---|---|---|---|---|---|---|---|---|---|
| 1 | 00 | x | 1 | 1 | 1 | 0 | 0 | 0 | 1 | 0 | 100 Ω |
| 1 | 01/10 | 1 | 1 | 0 | 1 | 0 | 0 | 1 | 1 | 0 | 15/60k Ω |
| 0 | 00 | x | 1 | 1 | 1 | 0 | 0 | 0 | 0 | 1 | 100 Ω |
| 0 | 01/10 | 1 | 1 | 0 | 0 | 1 | 1 | 0 | 0 | 1 | 15/60k Ω |

300

320

| Burn-in value | OTP_TH | OTP_SIDE | Rdp1/2 | Rdn1/2 | Mod_sw | Expected Value | Error Value | Threshold resistance value |
|---|---|---|---|---|---|---|---|---|
| 1 | 00 | x | 1 | 0 | 0 | 1 | 0 | 100 Ω |
| 1 | 01/10 | 1 | 1 | 0 | 1 | 1 | 0 | 15/60k Ω |
| 0 | 00 | x | 1 | 0 | 0 | 0 | 1 | 100 Ω |
| 0 | 01/10 | 0 | 0 | 1 | 1 | 1 | 0 | 15/60k Ω |

READING CIRCUIT FOR DIFFERENTIAL OTP MEMORY

CROSS-REFERENCE TO RELATED APPLICATION

This application is a Section 371 National Stage application of International Application No. PCT/CN2021/125343, filed on Oct. 21, 2021, and published as WO 2022/127361 A1, on Jun. 23, 2022, not in English, which claims priority to the Chinese Patent Application No. 202011508418.5, filed on Dec. 18, 2020, entitled "reading circuit for differential OTP memory", the contents of which are incorporated herein by reference in their entireties.

FIELD OF TECHNOLOGY

The present disclosure relates to a field of memory technologies, and in particular, to a reading circuit for differential one time programmable (OTP) memory.

DESCRIPTION OF THE RELATED ART

One time programmable (OTP) memory is a non-volatile memory that allows only one-time programming in an application, which may provide a flexible and inexpensive solution for circuit applications. Most of current structures that may implement OTP functions are based on dielectric breakdown OTP memory designs with efuse and antifuse. Efuse programming is usually achieved by using an overcurrent flowing through the fuse to fuse the fuse with its resistance value changes from tens of ohms ($\Omega$) to thousands of ohms or even higher. Antifuse programming is the opposite of efuse programming, in that the antifuse has a very high resistance value of several hundred megohms ($M\Omega$) before programming, and is broken by high voltage during programming, reducing the resistance to a kilo-ohm level or even lower for memory purposes.

Fuse type OTP memory is a one-time programming unit that uses metal or polysilicon as a fuse unit and uses an N-type metal oxide semiconductor (NMOS) field effect transistor structure connected to the fuse unit to change the fuse unit from an on state with low-resistance to an off state with high-resistance by overcurrent fusing the fuse when it is on. The fuse type OTP memory has strong programming flexibility and data reliability, and is widely used in embedded systems and key memory.

A read operation of the fuse type OTP memory is usually done by comparing a voltage value obtained by current flowing through the burned unit with a threshold value. However, a burned fuse, due to residual bridging or electronic migration, may be reconnected to reduce a burned resistance value and affect accuracy of readout data. A traditional solution to avoid this is to use a very high current to burn-in for a long enough time to ensure that the fuse burned, and at the same time, lower the threshold voltage for comparison, leaving room for the fuse to "grow". However, such an excessive design will lead to waste of area and power consumption.

Specifically, as shown in FIG. 1, an existing fuse type OTP memory and reading circuit 100 includes a fuse resistor (fuse) and a burn-in transistor M1 connected in series between a power supply and ground, and a threshold detection resistor (res) (generally several $K\Omega$) and a reading transistor M2 connected in series between the fuse resistor (fuse) and ground, wherein a control terminal of the burn-in transistor M1 is connected to a burn-in signal burn. The fuse type OTP memory 100 uses a connection node between the fuse resistor (fuse) and the burn-in transistor M1 to provide data (data), when not burned-in, the fuse resistor (fuse) resistance is very small, about 50 to 200$\Omega$; after the burn-in is completed, it may reach several $M\Omega$.

Burn-in operation: when OTP is to be programmed as 0, burn=0, no fuse is burned; when OTP is to be programmed as 1, burn=1 and lasts for a period of time, a very high current of up to vdd/Rfuse flows through the fuse and makes it burned;

Read operation: when not burned-in, Rfuse<<Rres, in this case if read=1, a voltage of node X is less than VDD/2, data=0; after fuse is burned-in, Rfuse>>Rres, in this case if read=1, the voltage of node X is greater than VDD/2, data=1. To ensure a result after programming as 1, make sure Rfuse>>Rres. Due to resistance value of the fuse Rfuse will be back to "long" after the fuse is burned, a resistance value of Rres should be set lower (but still much larger than the resistance value of the fuse that is unburned), but read current VDD/(Rfuse+Rres) and power consumption are very large in this way. If the OTP programmed to 0, that is, when not burning the fuse, such a large reading current may cause the fuse be burned by mistake.

SUMMARY

In order to solve above technical problems, the present disclosure provides a reading circuit for differential one time programmable (OTP) memory, which may read out data normally while completing detection of resistance value of the fuse, so as to ensure accuracy and reliability of readout data.

The present disclosure provides a reading circuit for a differential OTP memory which includes a first memory cell and a second memory cell in a differentially symmetrical structure, wherein the reading circuit is connected between the first memory cell and the second memory cell and includes a detector and a latch.

The detector has a first input connected to the first memory cell and a second input connected to the second memory cell, is configured to detect one of a resistance value of a first fuse of the first memory cell, a resistance value of a second fuse of the second memory cell and a resistance difference between the first fuse and the second fuse after a burn-in operation of the first memory or the second memory is completed.

The latch is connected to the detector, configured to provide a readout data according to one of the resistance value of the first fuse, the resistance value of the second fuse and the resistance difference between the first fuse and the second fuse detected by the detector.

Optionally, the reading circuit further including:
a control unit connected to the detector, configured to provide a plurality of control signals to the detector according to a bum-in signal of the bum-in operation, wherein the plurality of control signals are configured to control a detection operation of the detector.

Optionally, the first memory cell includes:
the first fuse and a first bum-in transistor connected in series between a power supply and ground, wherein a connection node of the first fuse and first burn-in transistor serves as a first node connecting to the first input of the detector.

Optionally, the second memory cell includes:
the second fuse and a second bum-in transistor connected in series between a power supply and ground, wherein a connection node of the second fuse and second burn-in transistor serves as a second node connecting to the second input of the detector.

Optionally, the burn-in signal includes a first burn-in signal and a second burn-in signal,
wherein the first burn-in signal is provided to a control terminal of the first burn-in transistor to control the burn-in operation of the first fuse; the second burn-in signal is provided to a control terminal of the second burn-in transistor for controlling the burn-in operation of the second fuse.

Optionally, the detector includes:
a first switch, a first transistor and a first current source connected in series between the first node and ground, wherein a connection node of the first transistor and the first current source serves as a first output of the detector for providing a first detection signal; and
a second switch, a second transistor and a second current source connected in series between the second node and ground, wherein a connection node of the second transistor and the second current source serves as a second output of the detector for providing a second detection signal.

Optionally, the detector further includes:
a third switch connected between a control terminal of the first transistor and a control terminal of the second transistor;
a fourth switch connected between a connection node of the third switch and the first transistor and ground;
a fifth switch connected between a connection node of the third switch and the second transistor and ground;
a sixth switch connected between a connection node of the third switch and of the first transistor and the first output;
a seventh switch connected between a connection node of the third switch and the second transistor and the second output.

Optionally, the plurality of control signals includes:
a first control signal for controlling an on-off state of the first switch;
a second control signal for controlling an on-off state of the second switch;
a third control signal for controlling an on-off state of the third switch;
a fourth control signal for controlling an on-off state of the fourth switch;
a fifth control signal for controlling an on-off state of the fifth switch;
a sixth control signal for controlling an on-off state of the sixth switch;
a seventh control signal for controlling an on-off state of the seventh switch.

Optionally, the first switch and the second switch are turned off, the first burn-in transistor or the second burn-in transistor are continuously on for a period of time, so that the burn-in operation of the first memory or the second memory is completed.

Optionally, in a case of the first switch, the second switch, the third switch and the sixth switch being in an on state, and the fourth switch, the fifth switch and the seventh switch being in an off state, the detector is configured to detect the resistance difference between the first fuse and the second fuse.

Optionally, in a case of the first switch, the second switch, the fifth switch and the sixth switch being in an on state, and the third switch, the fourth switch and the seventh switch being in an off state, the detector is configured to detect the resistance value of the second fuse.

Optionally, in a case of the first switch, the second switch, the fourth switch and the seventh switch being in the on state, and the third switch, the fifth switch and the sixth switch being in the off state, the detector is configured to detect the resistance value of the first fuse.

Optionally, the detector further includes:
a third switch connected between the first node and a first terminal of the second transistor, the second transistor having a first terminal connected to the second switch, and a second terminal serving as the second output of the detector connected to the second current source;
a fourth switch connected between the second node and a first terminal of the first transistor, the first transistor having the first terminal connected to the first switch, and a second terminal serving as the first output of the detector connected to the first current source, the second terminal of the first transistor being connected to a control terminal of the first transistor, and the control terminal of the first transistor being connected to a control terminal of the second transistor; and
a fifth switch, connected between the first terminal of the second transistor and a second terminal of the second transistor.

Optionally, the plurality of control signals includes:
a first control signal for controlling an on-off state of the first switch;
a second control signal for controlling an on-off state of the second switch;
a third control signal for controlling an on-off state of the third switch;
a fourth control signal for controlling an on-off state of the fourth switch;
a fifth control signal for controlling an on-off state of the fifth switch.

Optionally, the first switch, the second switch the third switch and the fourth switch are turned off, the first burn-in transistor or the second burn-in transistor are continuously on for a period of time, so that the burn-in operation of the first memory or the second memory is completed.

Optionally, in a case of the first switch and the second switch being in an on state, and the third switch, the fourth switch and the fifth switch being in an off state, the detector is configured to detect the resistance difference between the first fuse and the second fuse.

Optionally, in a case of the first switch, the second switch and the fifth switch being in an on state, and the third switch and the fourth switch being in an off state, the detector is configured to detect the resistance value of the second fuse.

Optionally, in a case of the third switch, the fourth switch, the fifth switch and the seventh switch being in the on state, and the first switch and the second switch being in the off state, the detector is configured to detect the resistance value of the first fuse.

Optionally, the latch includes:
a logic component having a third input connected to the first input of the detector, and a fourth input connected to the second input of the detector, the logic component generating the readout data according to the first detection signal and the second detection signal.

Optionally, any one of the first burn-in transistor, the second burn-in transistor, the first transistor and the second transistor is a metal oxide semiconductor field effect transistor.

Optionally, the first burn-in transistor and the second burn-in transistor are N-type metal oxide semiconductor field effect transistors, and the first transistor and the second transistor are P-type metal oxide semiconductor field effect transistors.

Optionally, the detector further includes:
a plurality of third current sources connected in parallel two ends of the first current source, any one of the plurality of third current sources providing a current proportional to a current provided by the first current source; and
a plurality of fourth current sources connected in parallel at two ends of the second current source, any one of the plurality of fourth current sources providing a current proportional to a current provided by said second current source.

Beneficial effects of the present disclosure: the present disclosure provides the reading circuit for the differential OTP memory, the OTP memory includes the first memory cell and the second memory cell in the differentially symmetrical structure, the reading circuit is connected between the first memory cell and the second memory cell and includes: the detector having the first input connected to the first memory cell and the second input connected to the second memory cell, configured to detect one of the resistance value of the first fuse of the first memory cell, the resistance value of the second fuse of the second memory cell and the resistance difference between the first fuse and the second fuse after the burn-in operation of the first memory or the second memory is completed; and the latch connected to the detector, configured to provide the readout data according to one of the resistance value of the first fuse, the resistance value of the second fuse and the resistance difference between the first fuse and the second fuse detected by the detector. The reading circuit is capable of both reading out data normally and detecting resistance value of the fuse, so as to ensure accuracy and reliability of the readout data.

BRIEF DESCRIPTION OF THE DRAWINGS

Through the following description of the embodiments of the present disclosure with reference to the accompanying drawings, the above and other objectives, features, and advantages of the present disclosure will be more apparent, in the accompanying drawings:

FIG. 5e shows an equivalent circuit diagram of the detector in the reading circuit shown in FIG. 5b when determining a resistance value of a first fuse after a burn-in operation of fuse in a further embodiment;

FIG. 5f shows a schematic table of true values of logic levels of each control signal and readout data corresponding to various read operations in an OTP memory after the read circuit shown in FIGS. 5d and 5e is burned-in;

FIG. 6b shows a structural schematic diagram of a detector in the reading circuit for the differential OTP memory shown in FIG. 6a;

FIG. 7 shows a structural schematic diagram of a latch in the reading circuit for the differential OTP memory shown in FIG. 6a;

FIG. 8c shows an equivalent circuit diagram of the detector in the reading circuit shown in FIG. 6a when determining a resistance value of a first fuse after a burn-in operation of fuse in a further embodiment;

FIG. 8d shows a schematic table of true values of logic levels of each control signal and readout data corresponding to various read operations in an OTP memory after the read circuit shown in FIGS. 5d and 5e is burned-in.

DETAILED DESCRIPTION OF THE DISCLOSURE

Figure 1:
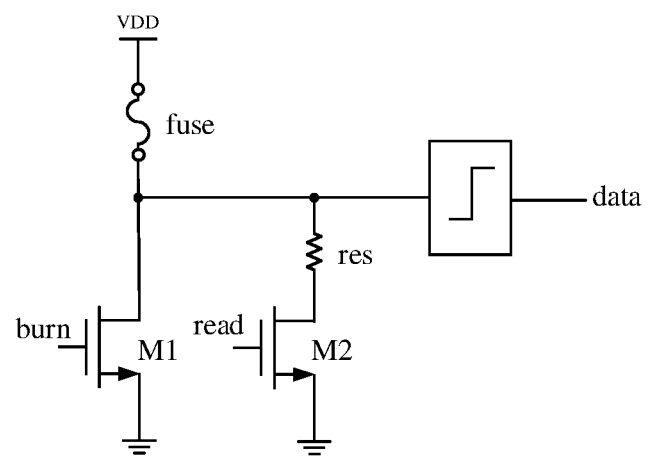
FIG. 1 shows a structural schematic diagram of a fuse type OTP memory and reading circuit in a prior art.

For ease of understanding the present disclosure, the present disclosure will be more fully described below with reference to relevant accompanying drawings. A preferred embodiment of the present disclosure is given in the accompanying drawings. However, the present disclosure may be implemented in different forms and is not limited to the embodiments described herein. Rather, these embodiments are provided for the purpose of providing a more thorough and comprehensive understanding of the present disclosure.

Unless otherwise defined, all technical and scientific terms used herein have the same meaning as commonly understood by those skilled in the art belonging to the present disclosure. Terms used herein in the specification of the present disclosure are for a purpose of describing specific embodiments only and are not intended to limit the present disclosure.

A structure of an existing fuse resistance is large at both ends and thin in middle, which has a resistance value of about 50 to 200Ω. When there is current, a current density at a middle part is higher, so when a large current flows through the fuse for a period of time, the middle of the fuse is more likely to be burned off, and a resistance may be up to sevreral megohms (MΩ) after burning; and the fused fuse needs to be used with a larger current or burned for a longer period of time, while the fused fuse, due to residual bridging or electronic-migration, may be connected again to reduce the fused resistance value, such as from several MΩ "grow" to dozens or hundreds of kilohms (KΩ).

Read operation of fused OTP memory is usually done by comparing the voltage value with a threshold value by current flowing through the fuse unit. However, the fused fuse, due to residual bridging or electronic-migration, may be reconnected to reduce the fused resistance value, affecting the accuracy of data readout. The traditional approach to avoid this is to use a very high current burn-in for a long enough time to ensure that the fuse burns out, and at the same time, lower the threshold voltage for comparison, leaving room for the fuse to "grow". However, such an excessive design will lead to waste of area and power consumption.

To solve such problems, a differential OTP memory is proposed in a prior art, which uses a double fuse cell, with data "0" or "1" corresponding to different fuses to be burned, and the same size of current flowing through the double fuse to get the read operation. The read operation uses the same size of current flow through the double fuse to get the voltage value directly compared, as long as the resistance value of the burned fuse is larger than the unburned one, the correct result may be compared. However, this method lowers the resistance detection threshold of the read circuit and reduces the design overscheduling, but the reliability of the readout data is still in doubt because the resistance value after the fuse "grows" is not known.

Based on this, the present disclosure provides an improved differential OTP reading circuit, which not only reads out a resistance difference between two fuses after a normal burn-in operation is completed, but also has a function of detecting a resistance value of each fuse to ensure accuracy and reliability of readout data in turn.

Hereinafter, the present disclosure is described in detail with reference to the accompanying drawings.

Figure 2:
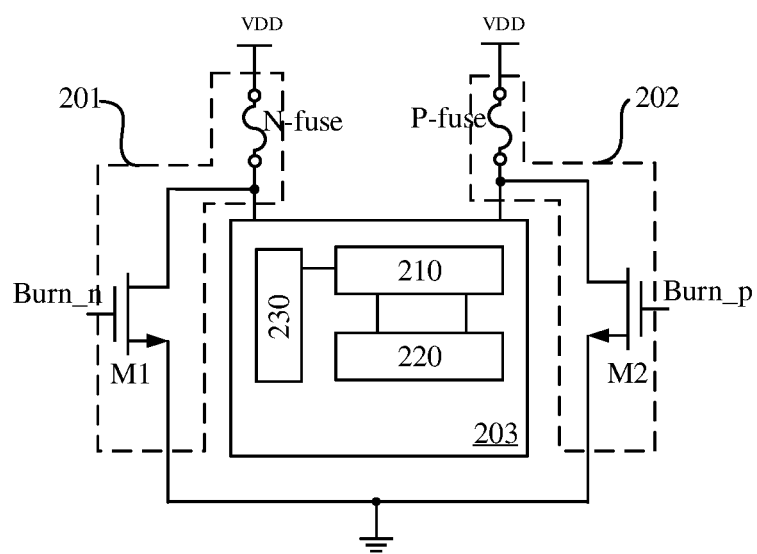
FIG. 2 shows a schematic block diagram of a reading circuit for a differential OTP memory according to a first embodiment of the present disclosure.
Figure 3:
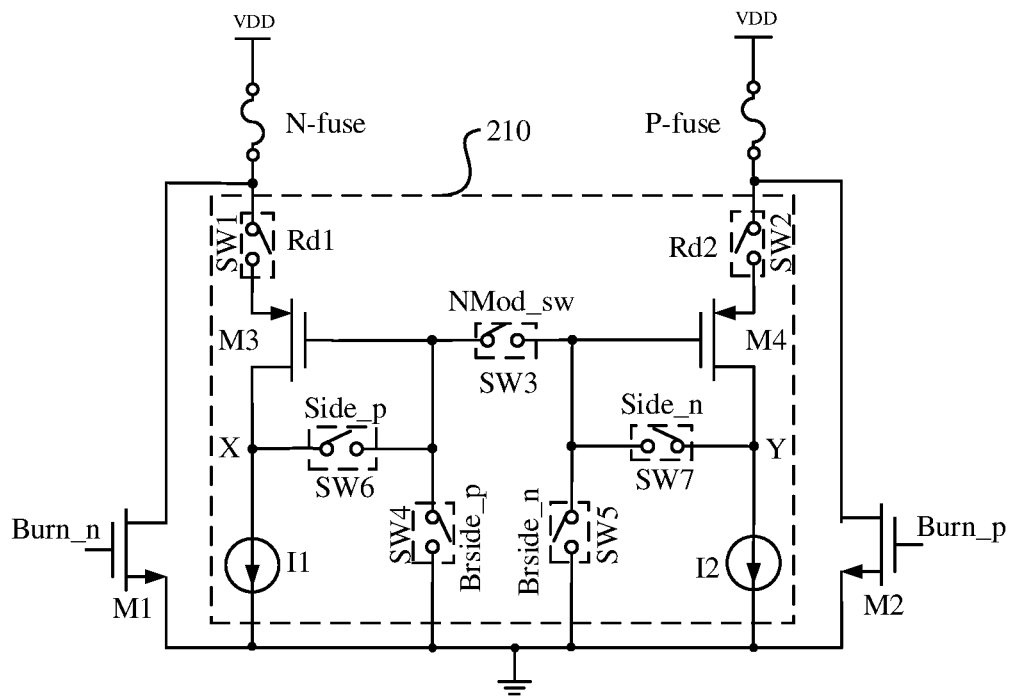
FIG. 3 shows a structural schematic diagram of a detector in the reading circuit for the differential OTP memory shown in FIG. 2.
Figure 4:
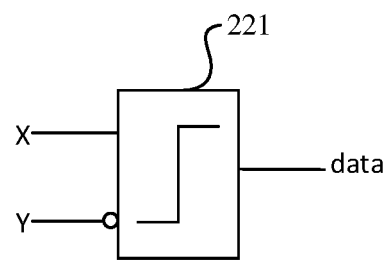
FIG. 4 shows a structural schematic diagram of a latch in the reading circuit for the differential OTP memory shown in FIG. 2.

FIG. 2 shows a schematic block diagram of a reading circuit for a differential OTP memory according to a first embodiment of the present disclosure, FIG. 3 shows a structural schematic diagram of a detector in the reading circuit for the differential OTP memory shown in FIG. 2, FIG. 4 shows a structural schematic diagram of a latch in the reading circuit for the differential OTP memory shown in FIG. 2.

Referring to FIGS. 2 to 4, a first embodiment of the present disclosure provides a reading circuit 203 for a differential OTP memory 200, which includes a first memory cell 201 and a second memory cell 202 in a differentially symmetrical structure, and the reading circuit 203 is connected between the first memory cell 201 and the second memory cell 202, which includes: a detector 210, latch 220 and control unit 230.

The detector 210 has a first input connected to the first memory cell 201 and a second input connected to the second memory cell 202, and is configured to detect a resistance value of a first fuse N-fuse located in the first memory cell 201, a resistance value of a second fuse P-fuse located in the second memory cell 202, and a resistance difference between the first fuse N-fuse and the second fuse P-fuse after a burn-in operation of the first memory cell 201 or the second memory cell 202 is completed; the latch 220 is configured to provide readout data according to one of the resistance value of the first fuse N-fuse, the resistance value of the second fuse P-fuse, and the resistance difference between the first fuse N-fuse and the second fuse P-fuse detected by the detector 210.

The control unit 230 is connected to the detector 210 for providing a plurality of control signals to the detector 210, wherein the plurality of control signals are configured to control a detection operation of the detector 210.

Further, the first memory cell 201 includes:
the first fuse N-fuse and a first burn-in transistor M1 connected in series between the power supply terminal and ground, and a connection node of the first fuse N-fuse and the first burn-in transistor M1 serves as a first node connecting to a first input of the detector 210.

Further, the second memory cell 202 includes:
the second fuse P-fuse and a second burn-in transistor M2 connected in series between the power supply terminal and ground, and a connection node of this second fuse P-fuse and the second burn-in transistor M2 serves as a second node connecting to a second input of the detector 210.

Further, burn-in signals include a first burn-in signal Burn_n and a second burn-in signal Burn_p, wherein the first burn-in signal Burn_n is provided to a control terminal of the first burn-in transistor M1 for controlling a burn-in operation of the first fuse N-fuse, and the second burn-in signal Burn_p is provided to a control terminal of the second burn-in transistor M2 for controlling a burn-in operation of the second fuse P-fuse.

Further, the detector 210 includes:
a first switch SW1, a first transistor M3 and a first current source I1 connected in series between the first node and ground, a connection node X of the first transistor M3 and the first current source I1 serving as a first output of the detector 210 for providing a first detection signal;
a second switch SW2, a second transistor M4 and a second current source I2 connected in series between the second node and ground, a connection node Y of the second transistor M4 and the second current source I2 serving as a second output of the detector 210 for providing a second detection signal.

As shown in FIG. 3, the detector 210 further includes: a third switch SW3, a fourth switch SW4, a fifth switch SW5, a sixth switch SW6 and a seventh switch SW7.

Wherein, the third switch SW3 is connected between a control terminal of the first transistor M3 and a control terminal of the second transistor M4; the fourth switch SW4 is connected between a connection node of the third switch SW3 and the first transistor M3 and ground; the fifth switch SW5 is connected between a connection node of the third switch SW3 and the second transistor M4 and ground; the sixth switch SW6 is connected between the connection node of the third switch SW3 and the first transistor M3 and the first output; the seventh switch SW7 is connected between the connection node of the third switch SW3 and the second transistor M4 and the second output.

In the embodiment, the plurality of control signals include: a first control signal Rd1, a second control signal Rd2 (the same as the first control signal Rd1 for simultaneous control of connection of the first fuse N-fuse to the first transistor M3 and connection of the second fuse P-fuse to the second transistor M4), a third control signal NMod_sw, a fourth control signal Brside_p, a fifth control signal Brside_n, a sixth control signal Side_p and a seventh control signal Side_n.

Wherein, the first control signal Rd1 is configured to logically control on-off state of the first switch SW1; the second control signal Rd2 is configured to logically control an on-off state of the second switch SW2; the third control signal NMod_sw is configured to logically control an on-off state of the third switch SW3; the fourth control signal Brside_p is configured to logically control an on-off state of the fourth The fourth control signal Brside_p is configured to logically control an on-off state of the fourth switch SW4; the fifth control signal Brside_n is configured to logically control an on-off state of the fifth switch SW5; the sixth control signal Side_p is configured to logically control an on-off state of the sixth switch SW6; the seventh control signal Side_n is configured to logically control an on-off state of the seventh switch SW7.

Further, the first switch SW1 and the second switch SW2 are in the off state, and the first burn-in transistor M1 and the second burn-in transistor M2 are continuously on for a period of time, so that the first fuse N-fuse or the second fuse P-fuse completes the burn-in operation.

Then, the first switch SW1, the second switch SW2, the third switch SW3 and the sixth switch SW6 are in the on state, and the fourth switch SW4, the fifth switch SW5 and the seventh switch SW7 are in the off state. In this case, the detector 210 is configured to detect the resistance difference between the first fuse N-fuse and the second fuse P-fuse.

Further, the first switch SW1, the second switch SW2, the fifth switch SW5 and the sixth switch SW6 are in the on state, and the third switch SW3, the fourth switch SW4 and the seventh switch SW7 are in the off state. In this case, the detector 210 is configured to detect the resistance value of the second fuse P-fuse.

Further, the first switch SW1, the second switch SW2, the fourth switch SW4 and the seventh switch SW7 are in the on state, and the third switch SW3, the fifth switch SW5 and the sixth switch SW6 are in the off state. In this case, the detector 210 is configured to detect the resistance value of the first fuse N-fuse.

Further, in the embodiment, the first current source I1 and the second current source I2 have the same configuration parameters, that is, I1=I2, wherien I1 is a current value provided by the first current source I1, I2 is t a current value provided by the second current source I2.

Referring to FIG. 4, in this embodiment, the latch 220 includes, for example, a logic component 221 having a third input connected to the first output (node X) of the detector 210 and a fourth input connected to the second output (node Y) of the detector 210, the logic component 221 generates the readout data (data) according to the first detection signal and the second detection signal.

Further, any one of the first burn-in transistor M1, the second burn-in transistor M2, the first switch transistor M3 and the second switch transistor M4 is a Metal Oxide Semiconductor Field-Effect Transistor (MOS transistor).

Further, the first burn-in transistor M1 and the second burn-in transistor M2 are both N-type MOS transistors, and the first switch transistor M3 and the second switch transistor M4 are both P-type MOS transistors. Of course, the disclosure is not limited to this, in other alternative embodiments, the first burn-in transistor M1 and the second burn-in transistor M2 may be P-type MOS transistors, and the first switch transistor M3 and the second switch transistor M4 may be N-type MOS transistors, and accordingly the burn-in signals (Burn_n and Burn_p) received by each of the control terminals of the first burn-in transistor M1 and the second burn-in transistor M2 will be changed, but it is also possible to read one of the resistance value of the first fuse N-fuse, the resistance value of the second fuse P-fuse, and the resistance difference between the first fuse N-fuse and the second fuse P-fuse by use of the detector 210 after the burn-in operation is completed.

Figure 5A:
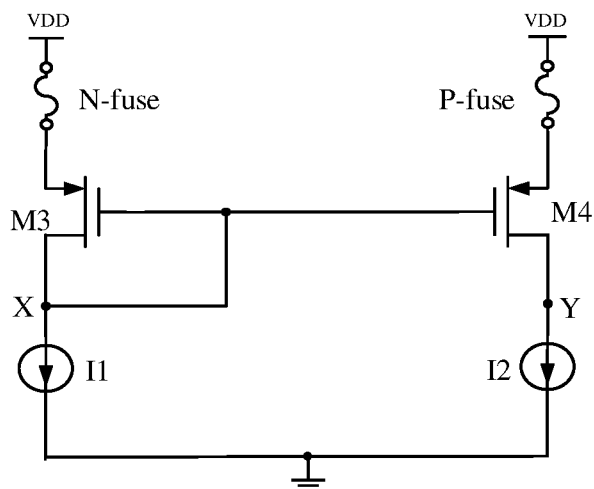
FIG. 5a shows an equivalent circuit diagram of the detector in the reading circuit shown in FIG. 3 when reading a resistance difference between fuses normally after a burn-in operation of fuse.
Figure 5B:
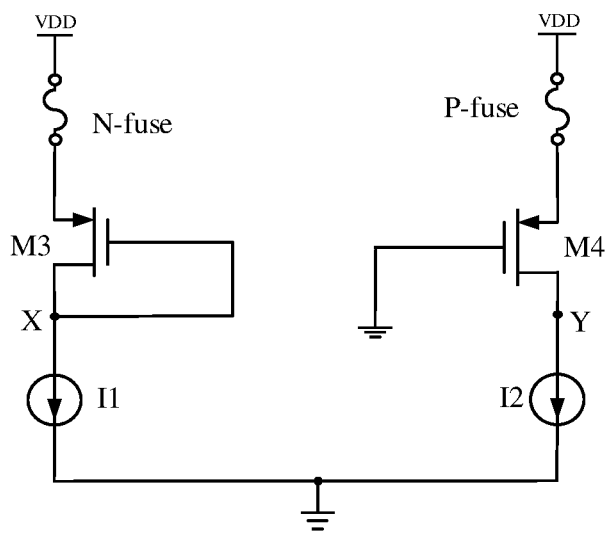
FIG. 5b shows an equivalent circuit diagram of the detector in the reading circuit shown in FIG. 3 when determining a resistance value of a second fuse after a burn-in operation of fuse.
Figure 5C:
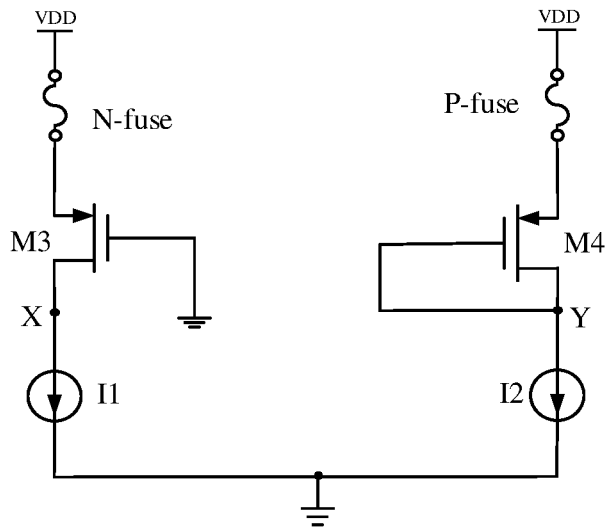
FIG. 5c shows an equivalent circuit diagram of the detector in the reading circuit shown in FIG. 3 when determining a resistance value of a first fuse after a burn-in operation of fuse.
Figure 5D:
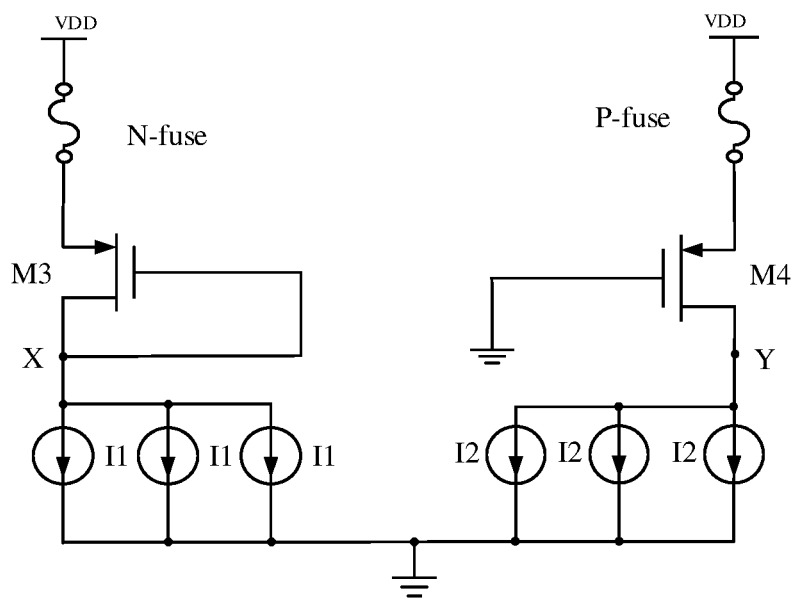
FIG. 5d shows an equivalent circuit diagram of the detector in the reading circuit shown in FIG. 5b when determining a resistance value of a second fuse after a burn-in operation of fuse in a further embodiment.
Figures 5E, 5F:
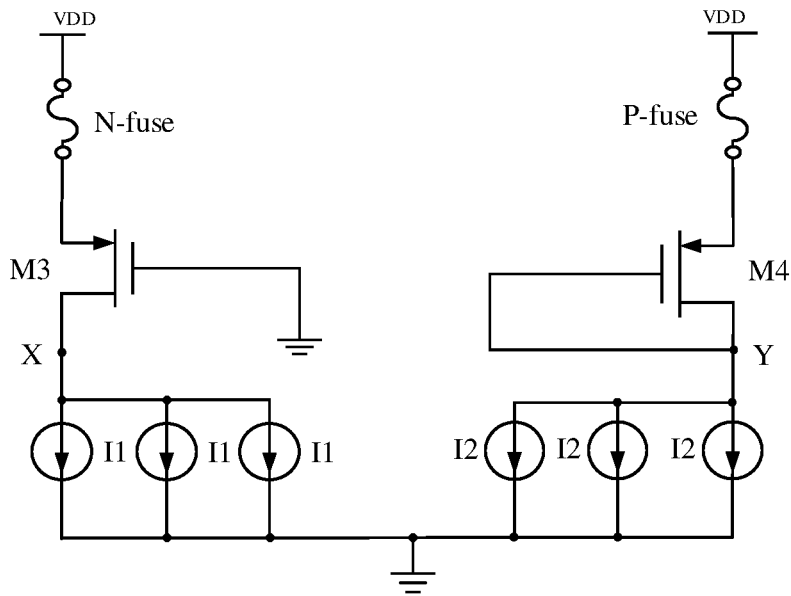

As shown in FIGS. 5d and 5e, in one embodiment of this embodiment, the detector 210 may further include:

a plurality of third current sources connected in parallel at both ends of the first current source I1, any one of the plurality of third current sources providing a current proportional to a current provided by the first current source I1; and a plurality of fourth current sources connected in parallel at both ends of the second current source I2, any one of the plurality of fourth current sources providing a current proportional to a current provided by the second current source I2.

Specifically, for example, the plurality of third current sources all provide the same current as the first current source I1, and the plurality of fourth current sources all provide the same current as the second current source I2. By designing the current source of the detector 210 as a multi-stage configuration, a corresponding resistance value judgment threshold may also have a number of grades to choose from, so that a range of the resistance after the fuse "grows" may be more clearly defined.

FIG. 5a shows an equivalent circuit diagram of the detector in the reading circuit shown in FIG. 3 when reading a resistance difference between fuses normally after a burn-in operation of fuse; FIG. 5b shows an equivalent circuit diagram of the detector in the reading circuit shown in FIG. 3 when determining a resistance value of a second fuse after a burn-in operation of fuse; FIG. 5c shows an equivalent circuit diagram of the detector in the reading circuit shown in FIG. 3 when determining a resistance value of a first fuse after a burn-in operation of fuse; FIG. 5d shows an equivalent circuit diagram of the detector in the reading circuit shown in FIG. 5b when determining a resistance value of a second fuse after a burn-in operation of fuse in a further embodiment; FIG. 5e shows an equivalent circuit diagram of the detector in the reading circuit shown in FIG. 5b when determining a resistance value of a first fuse after a burn-in operation of fuse in a further embodiment; FIG. 5f shows a schematic table of true values of logic levels of each control signal and readout data corresponding to various read operations in an OTP memory after the read circuit shown in FIGS. 5d and 5e is burned-in.

Specifically, the read circuit 203 for differential OTP memory 200 provided in this embodiment has a logic level of 0 for the first control signal Rdp1 to the fourth control signal Brside_p during the burn-in operation of the differential OTP memory 200, that is, the first switch SW1 to the fourth switch SW4 are off.

When the differential OTP memory 200 is to be burned-in with data 1, Rd1=Rd2=0, the logic level of the first burn-in signal Burn_n is 0, the logic level of the second burn-in signal Burn_p is 1, the first fuse N-fuse is not burned-in with a small resistance value, and the second fuse P-fuse is burned-in with a large resistance value.

When the differential OTP memory 200 is to be burned-in with data 0, Rd1=Rd2=0, the logic level of the first burn-in signal Burn_n is 1, the logic level of the second burn-in signal Burn_p is 0, the second fuse P-fuse is not burned-in with a small resistance value, and the first fuse N-fuse is burned-in with a large resistance value.

The read circuit 203 in the differential OTP memory 200 read operation is divided into following cases:

1) When the data data of this differential OTP memory 200 is read normally, the control unit 230 adjusts Rd1=Rd2=1, the third control signal NMod_sw=1, logic levels of the sixth control signal Side_p=1, the fourth control signal Brside_p, the seventh control signal Side_n and the fifth control signal Brside_n are both 0, an equivalent circuit of the reading circuit 203 is shown in FIG. 5a in this case.

Referring to FIG. 5a, the reading circuit 203 may be equated to an amplifier, and a small difference (about a few tens of ohms) between the resistance value of the second fuse P-fuse and he resistance value of the first fuse N-fuse in this case is amplified by the reading circuit 203 and output via node Y. When the second fuse P-fuse is burned, a voltage of node Y is lower than a voltage of node X since the resistance value of the second fuse P-fuse is greater than that of the first fuse N-fuse, and the logic level of readout data is 1; when the first fuse N-fuse is burned, the voltage of node Y is higher than that of node X since the resistance value of the first fuse N-fuse is greater than that of the second fuse P-fuse, and the logic level of readout data is 0.

In this embodiment, the resistance difference between the first fuse N-fuse and the resistance value of the second fuse P-fuse is reflected on node X and node Y, and is finally output as the readout data (data) by use of latch 220 (logic component 221).

When the resistance value of the fuse is to be determined:

a) If the resistance value of the second fuse P-fuse is to be determined, adjust Rd1=Rd2=1, NMod_sw=0, Side_p=1, Brside_p=0, Side_n=0, Brside_n=1, and I1=I2, in this case the equivalent circuit of this reading circuit 203 is shown in FIG. 5b.

The voltage of the node X is: $VX \approx VDD-I1*RN-VTHP$.
The voltage of the node Y is: $VY \approx VDD-I1*R$.

A voltage difference between node X and node Y is: $VX-VY=I1*(RP-RN)-VTHP$, where RP is the resistance value of the second fuse P-fuse, RN is the resistance value of the first fuse N-fuse, and VTHP is a threshold voltage corresponding to the resistance value judgment threshold, from which it may be seen that if $RP-RN>VTHP/I1$ and $VY-VX<0$, the logic level of data is 1, otherwise the logic level of data is 0. So that the reading circuit 203 may determine whether the resistance value of the second fuse P-fuse is greater than VTHP/I1, that is, the resistance value judgment threshold is VTHP/I1. For example, assuming that the threshold voltage VTHP is 0.9V, if I1 is designed to be $30uA$, then it may determine whether the resistance value of the second fuse P-fuse is greater than 30KΩ.

b) If the resistance value of the first fuse N-fuse is to be determined, adjust

Rd1=Rd2=1, NMod_sw=0, Side_p=0, Brside_p=1, Side_n=1, Brside_n=0, I1=I2, in this case the equivalent circuit of this reading circuit 203 is shown in FIG. 5c.

The same reference in the above mentioned a) may be obtained:

If $RP-RN>VTHP/I1$ and $VY-VX>0$, the logic level of data is 0, otherwise the logic level of data is 1. So that the reading circuit 203 may determine whether the resistance value of the first fuse N-fuse is greater than VTHP/I1.

3) Multi-file reading of the resistance value of the fuse

Reading the resistance value of the fuse (first fuse N-fuse or second fuse P-fuse) is to confirm that the resistance value (tens of KΩ or more) after the fuse "grows" is still far from the judgment resistance value (tens of Ω) normally read by the differential OTP memory 200, and furthermore, in order to make the differential OTP memory 200 is accurate and reliable. In the application process, the current source in the reading circuit 203 may be designed to be multi-stage configurable, as shown in FIGS. 5d and 5e, and the corresponding resistance value judgment threshold VTHP/I1 may also have many grades, so that the range of the resistance value after the fuse "grows" may be clarified.

For example, assuming that the threshold voltage VTHP is 0.9V, if the first current source I1 with the plurality of third current sources may be configured as 15 uA, 30 uA or 60 uA, the resistance threshold may be determined as 60KΩ, 30KΩ or 15KΩ.

Combining the cases of various read operations after the bum-in of this differential OTP memory 200 is completed, a schematic table of the corresponding read-out data is given according to the logic level true value of each control signal in the corresponding various read operations, as shown in FIG. 5f. Among them, OTP_TH 00 is the normal readout data mode; OTP_TH 01 is the detection of fuse resistance threshold mode 1 (such as resistance threshold of 15KΩ), when the current source current is 2*I1 (or 2*I2); OTP_TH 10 is the detection of fuse resistance threshold mode 2 (such as resistance threshold of 60KΩ), when the current source current is I1/2; OTP_SIDE is The logic level of the readout data is 0 to determine the resistance value of the first fuse N-fuse, and the logic level of the readout data is 1 to determine the resistance value of the second fuse P-fuse. The multi-satge configuration makes it possible to specify the range of the resistance value of the fuse of the reading circuit 203 after "growth".

Figure 6A:
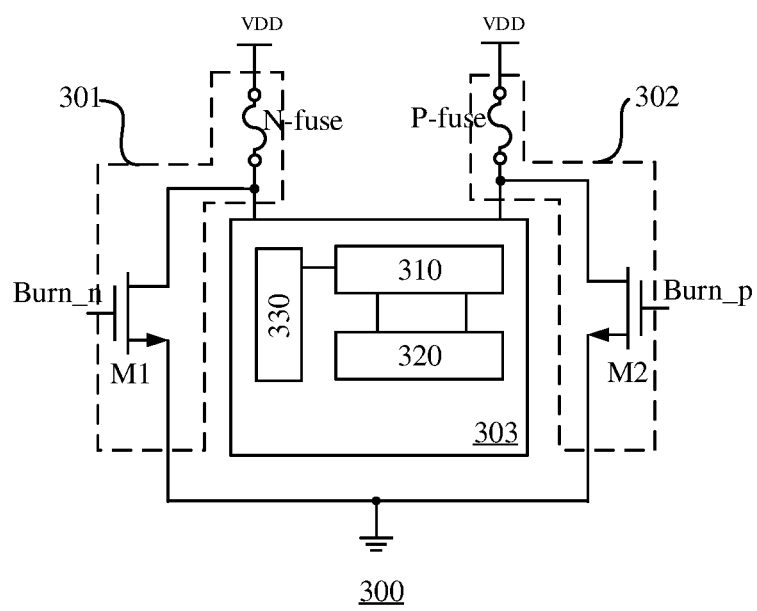
FIG. 6a shows a schematic block diagram of a reading circuit for a differential OTP memory according to a second embodiment of the present disclosure.
Figure 6B:
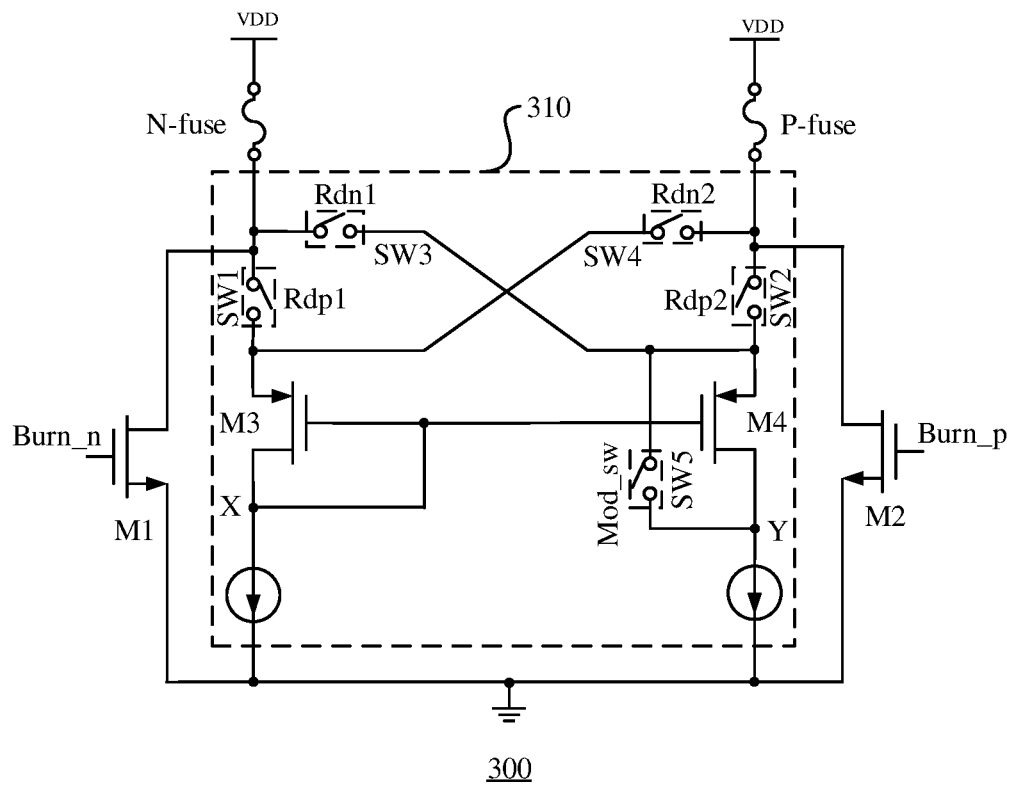
Figure 7:
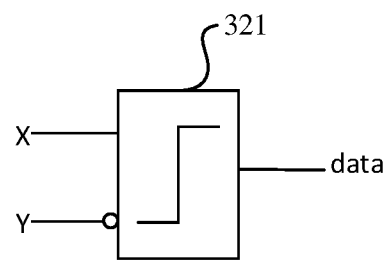

FIG. 6a shows a schematic block diagram of a reading circuit for a differential OTP memory according to a second embodiment of the present disclosure; FIG. 6b shows a structural schematic diagram of a detector in the reading circuit for the differential OTP memory shown in FIG. 6a; FIG. 7 shows a structural schematic diagram of a latch in the reading circuit for the differential OTP memory shown in FIG. 6a.

Referring to FIGS. 6a to 7, in the differential OTP memory 300 provided in the second embodiment of the present disclosure, similar to the first embodiment described above, the differential OTP memory 300 also includes: a first memory cell 301 and a second memory cell 302 in a differentially symmetrical structure, and the reading circuit 303 is connected between the first memory cell 301 and the second memory cell 302 and includes: a detector 310, a latch 320 and a control unit 330.

Wherein, the detector 310 has a first input connected to the first memory cell 301 and a second input connected to the second memory cell 302, and is configured to detect the resistance value of the first fuse N-fuse located in the first memory cell 301, the resistance value of the second fuse P-fuse located in the second memory cell 302, and the resistance difference between the first fuse N-fuse and the second fuse P-fuse, after the burn-in operation of the first memory cell 301 or the second memory cell 302 is completed.

The latch 320 is configured to provide readout data (data) according to one of the resistance value of the first fuse N-fuse, the resistance value of the second fuse P-fuse and the resistance difference between the first fuse N-fuse and the second fuse P-fuse detected by this detector 310.

The control unit 330 is connected to the detector 310 for providing a plurality of control signals to the detector 310 according to burn-in signals (Burn_n and Burn_p) controlling the burn-in operation, wherein the plurality of control signals are configured to control a detection operation of the detector 310.

A basic structure of the read circuit 303 in this embodiment is similar to that of the previous embodiment, where the differential OTP memory 300 is burned to read out data data=1 or data=0 by burning the second fuse P-fuse or the first fuse N-fuse. However, unlike the differential OTP memory 200 and reading circuit 203 in the previous embodiment, the circuit of the detector 310 in this example reads the resistance value of the first fuse N-fuse and the resistance value of the second fuse P-fuse by changing connection between the first fuse N-fuse and the second fuse P-fuse and the reading circuit 303.

In this embodiment, this first memory cell 301 includes:
a first fuse N-fuse and a first burn-in transistor M1 connected in series between a power supply terminal and ground, and a connection node of the first fuse N-fuse and the first burn-in transistor M1 serves as a first node connecting to a first input of the detector 310.

Further, the second memory cell 302 includes:
a second fuse P-fuse and a second burn-in transistor M2 connected in series between the power supply terminal and ground, and a connection node of this second fuse P-fuse and the second burn-in transistor M2 serves as a second node connecting to a second input of the detector 310.

Further, the burn-in signals include a first burn-in signal Burn_n and a second burn-in signal Burn_p, wherein the first burn-in signal Burn_n is provided to a control terminal of the first burn-in transistor M1 for controlling a burn-in operation of the first fuse N-fuse, and the second burn-in signal Burn_p is provided to a control terminal of the second burn-in transistor M2 for controlling a burn-in operation of the second fuse P-fuse.

In this embodiment, the detector 310 also includes:
a first switch SW1, a first transistor M3 and a first current source I1 connected in series between the first node and ground, a connection node X of the first transistor M3 and the first current source I1 serving as a first output of the detector 310 for providing a first detection signal;
a second switch SW2, a second transistor M4 and a second current source I2 connected in series between the second node and ground, a connection node Y of the second transistor M4 and the second current source I2 serving as a second output of the detector 310 for providing a second detection signal.

The first detection signal is configured to represent the resistance value of the first fuse N-fuse, and the second detection signal is configured to represent the resistance value of the second fuse P-fuse.

Referring to FIG. 6b, different form the previous embodiment, the detector 310 further includes: a third switch SW3, a fourth switch SW4 and a fifth switch SW5.

Wherein, the third switch SW3 is connected between the first node and a first terminal of the second transistor M4, which is connected to the second switch SW2, and a second terminal is connected to the second current source I2 as the second output of the detector 310; the fourth switch SW4 is connected between the second node and a first terminal of the first transistor M3, which is connected to the second current source I2; the fourth switch SW4 is connected between the second node and a first terminal of the first transistor M3, which is connected to the first switch SW1, and a second terminal serves as the first output of the detector 310 connecting to the first current source I1, the second terminal of the first transistor M3 is connected to a control terminal of the first transistor M3, and the control terminal of the first transistor M3 is connected to a control terminal of the second transistor M4; the fifth switch SW5 is connected between a first terminal of the second transistor M4 and its The fifth switch SW5 is connected between the first terminal and the second terminal of the second transistor M4.

Further, the plurality of control signals include: a first control signal Rdp1, a second control signal Rdp2, a third control signal Rdn1, a fourth control signal Brside_p, and a fifth control signal Mod_sw.

Wherein, the first control signal Rdp1 is configured to control an on-off state of the first switch SW1; the second control signal Rdp2 is configured to control an on-off state of the second switch SW2; the third control signal Rdn1 is configured to control an on-off state of the third switch SW3; the fourth control signal Brside_p is configured to control an on-off state of the fourth switch SW4; the fifth control signal Mod_sw is configured to control an on-off state of the fifth switch SW5.

Further, the first switch SW1, the second switch SW2, the third switch SW3 and the fourth switch SW4 are off, and the first fuse M1 and the second fuse M2 are continuously on for a period of time, so that the first fuse N-fuse or the second fuse P-fuse completes the burn-in operation.

Then, the first switch SW1 and the second switch SW2 are on, and the third switch SW3, the fourth switch SW4 and the fifth switch SW5 are off, and the detector 310 is configured to detect the resistance difference between the first fuse N-fuse and the second fuse P-fuse.

Further, the first switch SW1, the second switch SW2 and the fifth switch SW5 are on, and the third switch SW3 and the fourth switch SW4 are off. In this case, the detector 310 is configured to detect the resistance value of the second fuse P-fuse.

Further, the third switch SW3, the fourth switch SW4 and the fifth switch SW5 are on, and the first switch SW1 and the second switch SW2 are off. In this case, the detector 310 is configured to detect the resistance value of the first fuse N-fuse.

Further, the first control signal Rdp1 is the same as the second control signal Rdp2, and the third control signal Rdn1 is the same as the fourth control signal Brside_p.

Further, in this embodiment, this first current source I1 and this second current source I2 have the same configuration parameters, i.e. I1=I2, wherein I1 is a current value provided by this first current source I1 and I2 is a current value provided by this second current source I2.

Referring to FIG. 7, in this embodiment the latch 320 comprises, for example, a logic component 321, the third input of which is connected to the first output (node X) of the detector 310, the fourth input of which is connected to the second output (node Y) of the detector 310, the logic component 321 generating the readout according to the first detection signal and the second detection signal The logic controls the generation of the readout datadata.

Figure 8A:
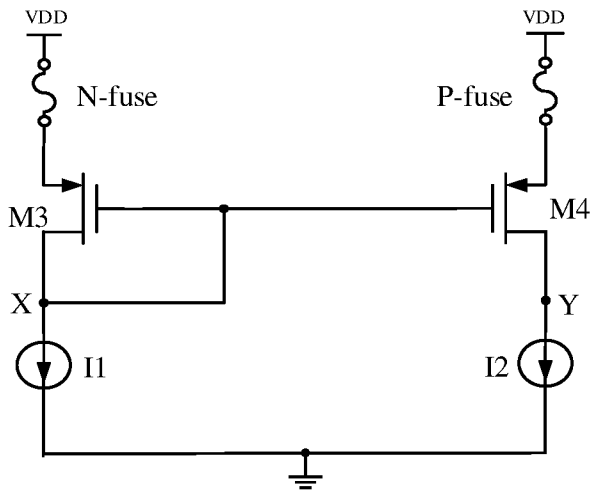
FIG. 8a shows an equivalent circuit diagram of the detector in the reading circuit shown in FIG. 6a when reading a resistance difference between fuses normally after a burn-in operation of fuse.
Figure 8B:
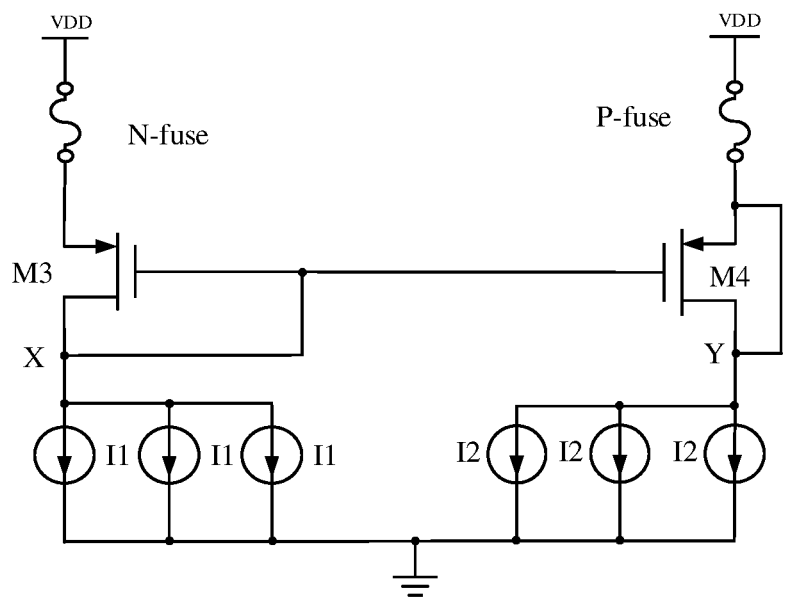
FIG. 8b shows an equivalent circuit diagram of the detector in the reading circuit shown in FIG. 6a when determining a resistance value of a second fuse after a burn-in operation of fuse in a further embodiment.
Figures 8C, 8D:
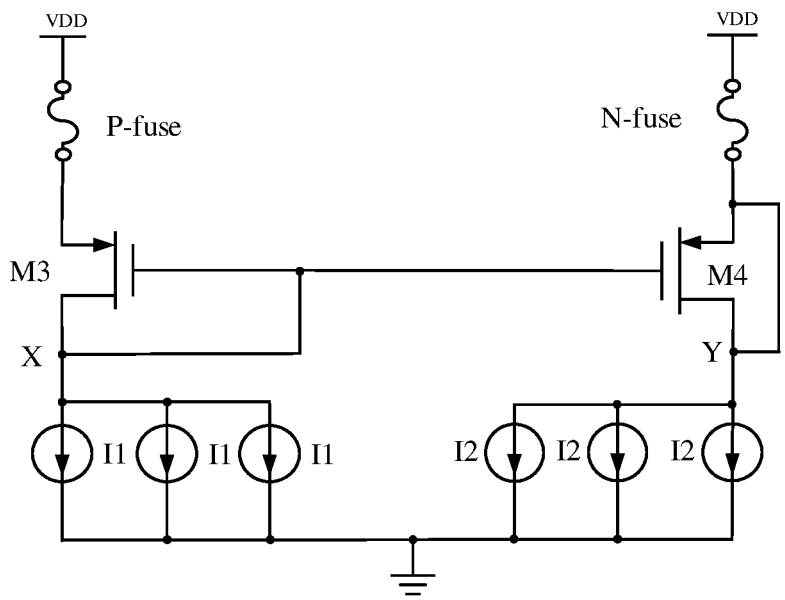

As shown in FIG. 8b and FIG. 8c, in one embodiment of this embodiment, the detector 310 may further include:
a plurality of third current sources connected in parallel at both ends of the first current source I1, any one of the plurality of third current sources providing a current proportional to a current provided by the first current source I1; and
a plurality of fourth current sources connected in parallel at both ends of the second current source I2, any one of the plurality of fourth current sources providing a current proportional to a current provided by the second current source I2.

Specifically, for example, the plurality of third current sources all provide the same current as the first current source I1, and the plurality of fourth current sources all provide the same current as the second current source I2. By designing the current source of the detector 210 as a multi-stage configuration, a corresponding resistance value judgment threshold may also have a number of grades to choose from, so that a range of the resistance after the fuse "grows" may be more clearly defined.

FIG. 8*a* shows an equivalent circuit diagram of the detector in the reading circuit shown in FIG. 6*a* when reading a resistance difference between fuses normally after a burn-in operation of fuse; FIG. 8*b* shows an equivalent circuit diagram of the detector in the reading circuit shown in FIG. 6*a* when determining a resistance value of a second fuse after a burn-in operation of fuse in a further embodiment; FIG. 8*c* shows an equivalent circuit diagram of the detector in the reading circuit shown in FIG. 6*a* when determining a resistance value of a first fuse after a burn-in operation of fuse in a further embodiment; FIG. 8*d* shows a schematic table of true values of logic levels of each control signal and readout data corresponding to various read operations in an OTP memory after the read circuit shown in FIGS. 5*d* and 5*e* is burned-in.

Specifically, the read circuit 303 provided in this embodiment for differential OTP memory 300 has a logic level of 0 for the first control signal Rdp1 to the fourth control signal Brside_p during the burn-in operation of the differential OTP memory 300, that is, the first switch SW1 to the fourth switch SW4 are off:

When the differential OTP memory 300 is to be burned-in with data 1, a logic level of the first burn-in signal Burn_n is 0, a logic level of the second burn-in signal Burn_p is 1, the first fuse N-fuse is not burned with a small resistance value, and the second fuse P-fuse is burned with a large resistance value;

When the differential OTP memory 300 is to be burned-in with data 0, a logic level of the first burn-in signal Burn_n is 1, a logic level of the second burn-in signal Burn_p is 0, the second fuse P-fuse is not burned with a small resistance value, and the first fuse N-fuse is burned with a large resistance value.

The reading circuit 303 for the differential OTP memory 300 in the reading operation is divided into following cases:

1) When data (data) of this differential OTP memory 300 is read normally, the control unit 330 adjusts Rd1=Rd2=1, logic levels of the sixth control signal Side_p=1, logic levels of the third control signal Rdn1, the fourth control signal Brside_p and the fifth control signal mod_sw are both 0, and an equivalent circuit of the reading circuit 303 is shown in FIG. 8*a* in this case.

Referring to FIG. 8*a*, the reading circuit 303 may also be equated to an amplifier, and in this case, a small difference (about a few tens of ohms) between the resistance value of the second fuse P-fuse and the resistance value of the first fuse N-fuse is amplified by the reading circuit 303 and output via node Y. When the second fuse P-fuse is burned, the voltage of node Y is lower than the voltage of node X because the resistance value of the second fuse P-fuse is greater than that of the first fuse N-fuse, and a logic level of readout data is 1; when the first fuse N-fuse is burned, the voltage of node Y is higher than that of node X since the resistance value of the first fuse N-fuse is greater than that of the second fuse P-fuse, and a logic level of readout data is 1. The voltage of node Y is higher than the voltage of node X, and a logic level of the readout data (data) is 0.

In this embodiment, the resistance difference between the first fuse N-fuse and the second fuse P-fuse is reflected on node X and node Y, and is finally output as the readout data (data) by use of latch 320 (logic component 321).

When the resistance value of the fuse is to be determined (refer to the multi-stage reading process of the resistance value of the fuse in the previous embodiment):

a) If the resistance value of the second fuse P-fuse is to be determined, adjust Rdp1=Rdp2=1, Rdn1=Rdn2=0, mod_sw=1, I1=I2, in this case the equivalent circuit of this reading circuit 303 is shown in FIG. 8*b*.

Similarly, referring to the operation of each node voltage in the scenario shown in FIG. 5*b* above, we may get here If RP-RN>VTHP/I1 and VY-VX<0, the logic level of data is 1, otherwise the logic level of data is 0. So that the reading circuit 303 may determine whether the resistance value of the second fuse P-fuse is greater than VTHP/I1.

b) If the resistance value of the first fuse N-fuse is to be determined, adjust

Rdp1=Rdp2=0, Rdn1=Rdn2=1, mod_sw=1, and I1=I2, in this case, the equivalent circuit of this reading circuit 303 is shown in FIG. 8*c*.

It may be seen that the positions of the second fuse P-fuse and the first fuse N-fuse are interchanged, so If RN-RP>VTHP/I1 and VY-VX<0, the logic level of data is 1, otherwise the logic level of data is 0. Thus, the reading circuit 303 may determine whether the resistance value of the first fuse N-fuse is greater than VTHP/I1.

It is important to understand that reading the resistance value of the fuse (first fuse N-fuse or second fuse P-fuse) is to confirm that the resistance value (tens of KΩ or more) after the fuse "grows" is still far from the judgment resistance value (tens of Ω) that the differential OTP memory 300 reads normally, and furthermore, in order to make the Further, in order to make the data read normally by the differential OTP memory 300 accurate and reliable. In the application process, the current source in the reading circuit 303 may be designed as multi-stage configurable, as shown in FIGS. 8*b* and 8*c*, and the corresponding resistance value judgment threshold VTHP/I1 will also have many grades, so that the range of the resistance value after the fuse "grows" may be clear.

After the completion of the differential OTP memory 300, the various read operations are combined, and the corresponding readout data is given according to the true value of the logic level of each control signal in the various read operations, as shown in FIG. 8*d*. Among them, OTP_TH 00 is the normal readout data mode; OTP_TH 01 is the detection of fuse resistance threshold mode 1 (such as resistance threshold of 15KΩ), when the current source current is 2*I1 (or 2*I2); OTP_TH 10 is the detection of fuse resistance threshold mode 2 (such as resistance threshold of 60KΩ), when the current source current is I1/2; OTP_SIDE is The logic level of the readout data is 0 to determine the resistance value of the first fuse N-fuse, and the logic level of the readout data is 1 to determine the resistance value of the second fuse P-fuse. The multi-stage configuration makes it possible to clarify the range of the resistance value of the fuse of the reading circuit 303 after "growth".

In summary, the embodiments of the present disclosure provide a reading circuit for differential OTP memory, which includes a first memory cell and a second memory cell in a differentially symmetrical structure, and the reading circuit is connected between the first memory cell and the second memory cell and includes: a detector having a first input connected to the first memory cell and a second input connected to the second memory cell, configured to detect one of a resistance value of a first fuse of the first memory cell, a resistance value of a second fuse of the second memory cell and a resistance difference between the first fuse and the second fuse after a burn-in operation of the first memory or the second memory is completed; and a latch connected to the detector, configured to provide a readout data according to one of the resistance value of the first fuse, the resistance value of the second fuse and the resistance difference between the first fuse and the second fuse detected by the detector. The reading circuit for differential OTP memory provided in each embodiment of the present disclosure may read out data normally and may detect the resistance value of the fuse to ensure accuracy and reliability of the readout data.

It should be noted that in the description of the present disclosure, it is to be understood that the terms "up", "down", "in", etc., indicating orientation or location relationships, are used only to facilitate the description of the present disclosure and to simplify the description. They do not indicate or imply that the component or element referred to must have a particular orientation, be constructed and operated in a particular orientation, and therefore are not to be construed as limiting the present disclosure.

In addition, for purposes of this document, the terms "including", "comprising" or any other variation thereof are intended to cover non-exclusive inclusion such that a process, method, article, or apparatus comprising a set of elements includes not only those elements, but also other elements not expressly listed, or other elements not expressly listed, or elements that are inherent to such process, method, article, or apparatus. Without further limitation, the elements defined by the statement "including a . . . " do not preclude the existence of additional identical elements in the process, method, article, or apparatus that include said elements.

Finally, it should be noted that, obviously, the above embodiments are examples only for the purpose of clearly illustrating the present disclosure and are not meant to limit the manner of implementation. For those of ordinary skill in the art, there are other variations or changes that may be made in different forms based on the above description. It is not necessary or possible to exhaust all embodiments here. The obvious variations or changes derived therefrom are still within the scope of protection of the present disclosure.

What is claimed is:

1. A reading circuit for a differential one time programmable (OTP) memory which comprises a first memory cell and a second memory cell in a differentially symmetrical structure, wherein the reading circuit is connected between the first memory cell and the second memory cell and comprises:
    a detector having a first input connected to the first memory cell and a second input connected to the second memory cell, configured to detect one of a resistance value of a first fuse of the first memory cell, a resistance value of a second fuse of the second memory cell and a resistance difference between the first fuse and the second fuse after a burn-in operation of the first memory or the second memory is completed; and
    a latch connected to the detector, configured to provide a readout data according to one of the resistance value of the first fuse, the resistance value of the second fuse and the resistance difference between the first fuse and the second fuse detected by the detector.

2. The reading circuit according to claim 1, further comprising:
    a control unit connected to the detector, configured to provide a plurality of control signals to the detector according to a burn-in signal of the burn-in operation, wherein the plurality of control signals are configured to control a detection operation of the detector.

3. The reading circuit according to claim 2, wherein the first memory cell comprises:
    the first fuse and a first burn-in transistor connected in series between a power supply and ground, wherein a connection node of the first fuse and first burn-in transistor serves as a first node connecting to the first input of the detector.

4. The reading circuit according to claim 3, wherein the second memory cell comprises:
    the second fuse and a second burn-in transistor connected in series between a power supply and ground, wherein a connection node of the second fuse and second burn-in transistor serves as a second node connecting to the second input of the detector.

5. The reading circuit according to claim 4, wherein the burn-in signal comprises a first burn-in signal and a second burn-in signal,
    wherein the first burn-in signal is provided to a control terminal of the first burn-in transistor to control the burn-in operation of the first fuse; the second burn-in signal is provided to a control terminal of the second burn-in transistor for controlling the burn-in operation of the second fuse.

6. The reading circuit according to claim 5, wherein the detector comprises:
    a first switch, a first transistor and a first current source connected in series between the first node and ground, wherein a connection node of the first transistor and the first current source serves as a first output of the detector for providing a first detection signal; and
    a second switch, a second transistor and a second current source connected in series between the second node and ground, wherein a connection node of the second transistor and the second current source serves as a second output of the detector for providing a second detection signal.

7. The reading circuit according to claim 6, wherein the detector further comprises:
    a third switch connected between a control terminal of the first transistor and a control terminal of the second transistor;
    a fourth switch connected between a connection node of the third switch and the first transistor and ground;
    a fifth switch connected between a connection node of the third switch and the second transistor and ground;
    a sixth switch connected between a connection node of the third switch and of the first transistor and the first output;
    a seventh switch connected between a connection node of the third switch and the second transistor and the second output.

8. The reading circuit according to claim 7, wherein the plurality of control signals comprises:
    a first control signal for controlling an on-off state of the first switch;
    a second control signal for controlling an on-off state of the second switch;
    a third control signal for controlling an on-off state of the third switch;
    a fourth control signal for controlling an on-off state of the fourth switch;
    a fifth control signal for controlling an on-off state of the fifth switch;
    a sixth control signal for controlling an on-off state of the sixth switch;
    a seventh control signal for controlling an on-off state of the seventh switch.

9. The reading circuit according to claim 8, wherein the first switch and the second switch are turned off, the first burn-in transistor or the second burn-in transistor are continuously on for a period of time, so that the burn-in operation of the first memory or the second memory is completed.

10. The reading circuit according to claim 9, wherein in a case of the first switch, the second switch, the third switch and the sixth switch being in an on state, and the fourth switch, the fifth switch and the seventh switch being in an off state, the detector is configured to detect the resistance difference between the first fuse and the second fuse.

11. The reading circuit according to claim 9, wherein in a case of the first switch, the second switch, the fifth switch and the sixth switch being in an on state, and the third switch, the fourth switch and the seventh switch being in an off state, the detector is configured to detect the resistance value of the second fuse.

12. The reading circuit according to claim 9, wherein in a case of the first switch, the second switch, the fourth switch and the seventh switch being in the on state, and the third switch, the fifth switch and the sixth switch being in the off state, the detector is configured to detect the resistance value of the first fuse.

13. The reading circuit according to claim 6, wherein the detector further comprises:
a third switch connected between the first node and a first terminal of the second transistor, the second transistor having a first terminal connected to the second switch, and a second terminal serving as the second output of the detector connected to the second current source;
a fourth switch connected between the second node and a first terminal of the first transistor, the first transistor having the first terminal connected to the first switch, and a second terminal serving as the first output of the detector connected to the first current source, the second terminal of the first transistor being connected to a control terminal of the first transistor, and the control terminal of the first transistor being connected to a control terminal of the second transistor; and
a fifth switch, connected between the first terminal of the second transistor and a second terminal of the second transistor.

14. The reading circuit according to claim 13, wherein the plurality of control signals comprises:
a first control signal for controlling an on-off state of the first switch;
a second control signal for controlling an on-off state of the second switch;
a third control signal for controlling an on-off state of the third switch;
a fourth control signal for controlling an on-off state of the fourth switch;
a fifth control signal for controlling an on-off state of the fifth switch.

15. The reading circuit according to claim 14, wherein the first switch, the second switch the third switch and the fourth switch are turned off, the first burn-in transistor or the second burn-in transistor are continuously on for a period of time, so that the burn-in operation of the first memory or the second memory is completed.

16. The reading circuit according to claim 15, wherein in a case of the first switch and the second switch being in an on state, and the third switch, the fourth switch and the fifth switch being in an off state, the detector is configured to detect the resistance difference between the first fuse and the second fuse.

17. The reading circuit according to claim 15, wherein in a case of the first switch, the second switch and the fifth switch being in an on state, and the third switch and the fourth switch being in an off state, the detector is configured to detect the resistance value of the second fuse.

18. The reading circuit according to claim 15, wherein in a case of the third switch, the fourth switch, the fifth switch and the seventh switch being in the on state, and the first switch and the second switch being in the off state, the detector is configured to detect the resistance value of the first fuse.

19. The reading circuit according to claim 8, wherein the latch comprises:
a logic component having a third input connected to the first input of the detector, and a fourth input connected to the second input of the detector, the logic component generating the readout data according to the first detection signal and the second detection signal.

20. The reading circuit according to claim 6, wherein any one of the first burn-in transistor, the second burn-in transistor, the first transistor and the second transistor is a metal oxide semiconductor field effect transistor.

21. The reading circuit according to claim 20, wherein the first burn-in transistor and the second burn-in transistor are N-type metal oxide semiconductor field effect transistors, and the first transistor and the second transistor are P-type metal oxide semiconductor field effect transistors.

22. The reading circuit according to claim 20, wherein the detector further comprises:
a plurality of third current sources connected in parallel two ends of the first current source, any one of the plurality of third current sources providing a current proportional to a current provided by the first current source; and
a plurality of fourth current sources connected in parallel at two ends of the second current source, any one of the plurality of fourth current sources providing a current proportional to a current provided by said second current source.

* * * * *